US012632074B2

(12) United States Patent
Wen et al.

(10) Patent No.: US 12,632,074 B2
(45) Date of Patent: May 19, 2026

(54) CURRENT LIMITER, METHOD OF OPERATING THE SAME, AND HOTSWAP MODULE

(71) Applicant: Telefonaktiebolaget LM Ericsson (publ), Stockholm (SE)

(72) Inventors: Chao Wen, Beijing (CN); Tai Ma, Beijing (CN)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 453 days.

(21) Appl. No.: 18/028,935

(22) PCT Filed: Sep. 29, 2020

(86) PCT No.: PCT/CN2020/118702
§ 371 (c)(1),
(2) Date: Mar. 28, 2023

(87) PCT Pub. No.: WO2022/067466
PCT Pub. Date: Apr. 7, 2022

(65) Prior Publication Data
US 2024/0012437 A1 Jan. 11, 2024

(51) Int. Cl.
*G05F 1/573* (2006.01)
*G05F 1/571* (2006.01)
(Continued)

(52) U.S. Cl.
CPC ............ *G05F 1/5735* (2013.01); *G05F 1/571* (2013.01); *H03K 17/08104* (2013.01); *G06F 1/30* (2013.01); *H03K 2217/0081* (2013.01)

(58) Field of Classification Search
CPC ..... G05F 1/10; G05F 1/30; G05F 1/46; G05F 1/461; G05F 1/462; G05F 1/468;
(Continued)

(56) References Cited

U.S. PATENT DOCUMENTS 5,883,504 A 3/1999 Okada
8,278,997 B1 10/2012 Kim et al.
(Continued)

FOREIGN PATENT DOCUMENTS

| CN | 107153439 A | 9/2017 |
| CN | 109830947 A | 5/2019 |
| WO | 2007/058569 A1 | 5/2007 |

OTHER PUBLICATIONS

International Search Report and Written Opinion issued in International Application No. PCT/CN2020/118702 dated Jun. 24, 2021 (9 pages).

*Primary Examiner* — Thienvu V Tran
*Assistant Examiner* — Carlos O Rivera-Perez
(74) *Attorney, Agent, or Firm* — Rothwell, Figg, Ernst & Manbeck, P.C.

(57) ABSTRACT

The present disclosure presents a current limiter, a method of operating the same, and a hotswap module comprising the same. The current limiter comprises: a current limiting module having an input terminal, an output terminal, and a control terminal, and configured to limit a current, which is input via its input terminal, within a current limiting range; and a range controlling module having a control terminal coupled top the control terminal of the current limiting module and a sensing terminal coupled to the output terminal of the current limiting module, and configured to generate a control signal at least based on the current which is output via the output terminal of the current limiting module and which is sensed at the sensing terminal, and output the control signal via its control terminal, such that the current limiting range is dynamically adjustable based on the control signal.

20 Claims, 6 Drawing Sheets

(51) Int. Cl.
 *H03K 17/081* (2006.01)
 *G06F 1/30* (2006.01)

(58) Field of Classification Search
 CPC . G05F 1/56; G05F 1/565; G05F 1/569; G05F 1/571; G05F 1/573; G05F 1/5735; G05F 1/575; G05F 1/62; H03K 17/08; H03K 17/081; H03K 17/08104; H03K 17/08112; H03K 17/08116; H03K 17/0812; H03K 17/08122; H03K 17/08126; H03K 17/08128; H03K 17/0814; H03K 17/08142; H03K 17/08146; H03K 17/08148; H03K 17/082; H03K 17/0822; H03K 17/0826; H03K 17/0828; H03K 17/12; H03K 17/122; H03K 17/127; H03K 2217/0081; G06F 1/18; G06F 1/183; G06F 1/186; G06F 1/26; G06F 1/28; G06F 1/30; G06F 1/305; G06F 1/32; G06F 1/3203; G06F 1/3206; G06F 1/3215; G06F 1/3296; H02H 3/20; H02H 3/207; H02H 9/001; H02H 9/004; H02H 9/02; H02H 9/021; H02H 9/023; H02H 9/025; H02H 9/026; H02H 9/028; H02M 1/00; H02M 1/0003; H02M 1/0009; H02M 1/0025; H02M 1/0029; H02M 1/32; H02M 1/325; H02M 1/36; H02M 3/02; H02M 3/04; H02M 3/06; H02M 3/135; H02M 3/137; H02M 3/155; H02M 3/156; H02M 3/1566; H02M 3/157; H02M 3/158; H02M 3/1588
 USPC ............... 323/222–226, 238, 266, 269–278, 323/281–285, 299, 312, 313, 351, 901, 323/908; 363/49, 50, 56.03–56.12, 123, 363/124; 361/18, 71–75, 78, 79, 83, 86, 361/87, 93.1–101
 See application file for complete search history.

(56) References Cited

U.S. PATENT DOCUMENTS

| | | | |
|---|---|---|---|
| 10,424,939 B2 | 9/2019 | O'Sullivan et al. | |
| 2003/0095368 A1 | 5/2003 | Daniels et al. | |
| 2004/0085698 A1 | 5/2004 | Ball et al. | |
| 2008/0160370 A1 | 7/2008 | Masse et al. | |
| 2017/0126222 A1* | 5/2017 | O'Sullivan | H03K 17/08122 |
| 2018/0102774 A1 | 4/2018 | Leong et al. | |
| 2019/0103864 A1 | 4/2019 | Rogachev | |
| 2019/0279977 A1 | 9/2019 | Ma et al. | |

* cited by examiner

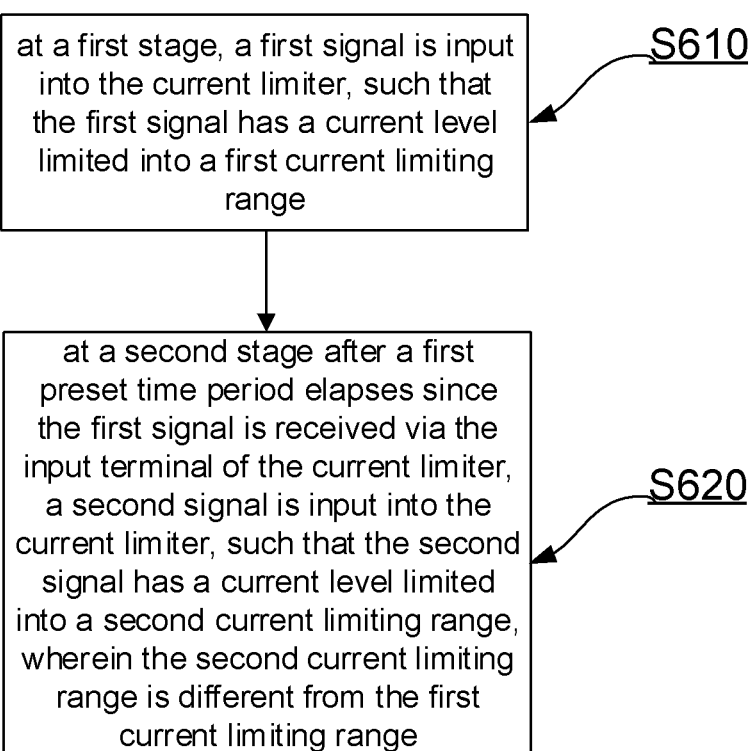

__600__ at a first stage, a first signal is input into the current limiter, such that the first signal has a current level limited into a first current limiting range — S610 at a second stage after a first preset time period elapses since the first signal is received via the input terminal of the current limiter, a second signal is input into the current limiter, such that the second signal has a current level limited into a second current limiting range, wherein the second current limiting range is different from the first current limiting range — S620

FIG. 6

CURRENT LIMITER, METHOD OF OPERATING THE SAME, AND HOTSWAP MODULE

CROSS REFERENCE TO RELATED APPLICATIONS

This application is a 35 U.S.C. § 371 National Stage of International Patent Application No. PCT/CN2020/118702, filed 2020 Sep. 29

TECHNICAL FIELD

The present disclosure is related to the field of electronic device, and in particular, to a current limiter, a method of operating the same, and a hotswap module comprising the same.

BACKGROUND

High-availability systems, such as servers, network switches, redundant-array-of-independent-disk (RAID) storage, and other forms of communications infrastructure, need to be designed for near-zero downtime throughout their useful life. If a component of such a system fails or needs updating, it must be replaced without interrupting the rest of the system. A board or component will have to be removed and its replacement plugged in while the system remains up and running. This process is known as hot swapping, or in some cases hot plugging. To hot swap safely, each printed-circuit board (PCB) or plug-in component has an on-board hot-swap module to facilitate the safe removal and insertion of the board from a live backplane.

A typical hot swapping technology is the linear mode hot swapping. It means that a metal oxide semiconductor field effect transistor (MOSFET) in the hotswapping module works under the linear mode. Under the linear mode, the MOSFET acts as a gate voltage-controlled resistor. The higher its gate voltage is, the lower the MOSFET Rdson (i.e. conduction resistance) is. By controlling its gate voltage, Rdson may control an inrush current within a specified range.

Another hot swapping technology is the switching mode hot swapping. It means that the MOSFET works under the switching state. The switching mode hotswap works like a buck converter controlled by a current hysteresis. The current is sensed at the output terminal of an inductor in the buck converter. When the current has a level above the high limit of the current hysteresis, the switching MOSFET will be switched off and wait for the current to decline. After the current declines below the low limit of the current hysteresis, the switching MOSFET will be switched on again. In this way, the inrush current can be controlled.

However, the linear mode MOSFET must work inside of SOA (Safe Operating Area). The inrush current is small and limited by the SOA, and therefore the charging time will be long according to the equation:

$$t=(C*V)/I,$$

where t is the charging time, C is the output capacitance, V is the input voltage, and I is the inrush current. The greater the output capacitance is, the longer the charging time is (because I and V are fixed), and the wider the charging MOSFET SOA is required. As the inrush current is far below normal load current, after the charging process is finished, the charging MOSFET will be typically shorted by a low resistance path (e.g.

several fully conducted MOSFETs) to prevent the charging MOSFET from working with the normal load. Therefore, the disadvantages of this kind of circuit may be:

(1) Charging MOSFET SOA is the bottle neck and it is hard to meet requirement with greater output capacitance;

(2) The surge current will be passed to holdup capacitors directly from the input port and cause holdup voltage very high because the charging MOSFET is not functioning. The holdup capacitors will bear high surge voltage and may be damaged. In other words, the pass-through energy may damage the equipment easily.

On the other hand, although the switching mode hotswap module is not sensitive to the output capacitance, the max inrush current is almost 2 times of the maximum input current with a full load. In such a case, the high inrush current may cause following issues:

(1) PSU (Power Supply Unit) OCP (Over Current Protection) may be triggered easily; and (2) Severe power line LC resonant. The MOSFET in the hot swap module may be damaged during the power up phase due to LC resonant.

SUMMARY

According to a first aspect of the present disclosure, a current limiter comprising: a current limiting module having an input terminal, an output terminal, and a control terminal, and configured to limit a current, which is input via its input terminal, within a current limiting range; and a range controlling module having a control terminal coupled to the control terminal of the current limiting module and a sensing terminal coupled to the output terminal of the current limiting module, and configured to generate a control signal at least based on the current which is output via the output terminal of the current limiting module and which is sensed at the sensing terminal, and output the control signal via its control terminal, such that the current limiting range is dynamically adjustable based on the control signal.

In some embodiments, the current limiting module comprises: a switch having a first terminal serving as the input terminal of the current limiting module, a second terminal, and a control terminal serving as the control terminal of the current limiting module, and configured to be switched on or off in response to an ON or OFF signal input via the control terminal; an inductor having a first terminal coupled to the second terminal of the switch and a second terminal serving as the output terminal of the current limiting module; and a diode having a first terminal coupled to the second terminal of the switch and a second terminal being grounded, wherein the forward direction of the diode is from the first terminal to the second terminal. In some embodiments, the switch is a metal oxide semiconductor field effect transistor, MOS-FET, and the first terminal of the MOSFET is one of its source and drain, the second terminal of the MOSFET is the other of its source and drain, and the control terminal of the MOSFET is its gate. In some embodiments, the MOSFET is an N-type MOSFET, and the ON signal is a high level voltage signal and the OFF signal is a low level voltage signal.

In some embodiments, the current limiting module further comprises: a capacitor having a first terminal coupled to the second terminal of the inductor and a second terminal being grounded.

In some embodiments, the range controlling module comprises: a charging completion indicating module having an input terminal and an output terminal, and configured to output a charging completion indicating signal via the output terminal after a first preset time period elapses since a first trigger signal is received via the input terminal; a range selecting module having an input terminal coupled to the output terminal of the charging completion indicating module and an output terminal, and configured to initially output a first range selection signal via its output terminal, and output a second range selection signal via its output terminal when the charging completion indicating signal is received via its input terminal, the second range selection signal being associated with a different current limiting range than that associated with the first range selection signal; a current sensing module having a first terminal serving as the sensing terminal of the range controlling module and a second terminal, and configured to sense the current at its first terminal and output a sensing signal indicative of the sensed current via its second terminal; and a switch driving module having a first terminal coupled to the output terminal of range selecting module, a second terminal coupled to the second terminal of the current sensing module, and a third terminal serving as the control terminal of the range controlling module, and configured to output the control signal based on the signals received at the first terminal and the second terminal.

In some embodiments, the input terminal of the charging completion indicating module is coupled to the third terminal of the switch driving module, and the first trigger signal is the last ON signal input into the control terminal of the current limiting module after which no OFF signal is input into the control terminal of the current limiting module until the expiration of the first preset time period, and the first preset time period is 10 ms.

In some embodiments, the charging completion indicating signal is a high level voltage signal, the first range selection signal is a low level voltage signal, and the second range selection signal is a high level voltage signal. In some embodiments, the sensing signal is a voltage signal having a level indicative of the current sensed at the first terminal of the current sensing module.

In some embodiments, the range selecting module comprises: an OR gate having a first input terminal serving as the input terminal of the range selecting module, a second input terminal, and a third output terminal serving as the output terminal of the range selecting module, and configured to perform an logical OR operation on the inputs from the first and second input terminals and output a signal indicative of the result of the logical OR operation via the third output terminal; and an auxiliary power supply having a first terminal coupled to the third output terminal of the OR gate, a second terminal coupled to the output terminal of the current limiting module, a third terminal coupled to the ground, and a fourth terminal coupled to the second input terminal of the OR gate, and configured to output an auxiliary power OK signal via the fourth terminal after an auxiliary power enable signal is received via the first terminal. In some embodiments, each of the auxiliary power OK signal and the auxiliary power enable signal is a high level voltage signal.

In some embodiments, the switch driving module comprises: a range signal processing module having an input terminal coupled to the output terminal of the range selecting module and an output terminal, and configured to output a reference signal via the output terminal which is dynamically determined based on the signal received via the input terminal; and a comparator having a first input terminal coupled to the output terminal of the range signal processing module, a second input terminal coupled to the second terminal of the current sensing module, and an output terminal serving as the third terminal of the switch driving module, and configured to output the control signal via the output terminal based on the comparison of the reference signal and the sensing signal received via the first input terminal and the second input terminal, respectively. In some embodiments, the range controlling module further comprises an enable terminal, wherein the current limiter further comprises a voltage protection module having a first terminal coupled to the input terminal of the current limiting module, a second terminal coupled to the ground, and a third terminal coupled to the enable terminal of the range controlling module, and configured to output an enable signal via the third terminal when a voltage detected across its first terminal and its second terminal is within a safe range. In some embodiments, the enable signal is a high level voltage signal. In some embodiments, the switch driving module comprises: a range signal processing module having an input terminal coupled to the output terminal of the range selecting module and an output terminal, and configured to output a reference signal via the output terminal which is dynamically determined based on the signal received via the input terminal; a comparator having a first input terminal coupled to the output terminal of the range signal processing module, a second input terminal coupled to the second terminal of the current sensing module, and an output terminal, and configured to output the control signal via the output terminal based on the comparison of the reference signal and the sensing signal received via the first input terminal and the second input terminal, respectively; and a switch driver has a first terminal coupled to the output terminal of the comparator, and a second terminal serving as the third terminal of the switch driving module, and a third terminal serving as the enable terminal of the range controlling module, and configured to output the control signal only when the enable signal is received at its third terminal.

In some embodiments, the charging completion indicating module further comprises a disable terminal coupled to the enable terminal of the switch driver, and further configured to output a disable signal via the disable terminal after a second preset time period elapses since a second trigger signal is received via the input terminal. In some embodiments, the disable signal is a low level voltage signal, which is capable of overriding the enable signal output from the voltage protection module. In some embodiments, the input terminal of the charging completion indicating module is coupled to the third terminal of the switch driving module, wherein the second trigger signal is the first ON signal input into the control terminal of the current limiting module after the enable signal is changed from a low level voltage signal to a high level voltage signal, and wherein the second preset time period is 250 ms.

In some embodiments, the range signal processing module comprises: a first transistor having a first terminal, a second terminal coupled to the ground, and a control terminal serving as the input terminal of the range signal processing module; a second transistor having a first terminal, a second terminal coupled to the ground, and a control terminal coupled to the first terminal of the first transistor; a first resistor having a first terminal coupled to a direct current (DC) power supply and a second terminal coupled to the first terminal of the first transistor; a second resistor (454) having a first terminal coupled to the first input terminal of the comparator and a second terminal coupled to the first terminal of the second transistor; a third resistor having a first terminal coupled to the first input terminal of the comparator and a second terminal coupled to the ground; a fourth resistor having a first terminal coupled to the DC power supply and a second terminal coupled to the first input terminal of the comparator; and a fifth resistor having a first terminal coupled to the output terminal of the comparator and a second terminal coupled to the first input terminal of the comparator.

According to a second aspect, a hotswap module for an electronic device is provided. The hotswap module comprises a current limiter of the first aspect of the present disclosure.

According to a third aspect, a method of operating a current limiter of the first aspect is provided. The method comprises: at a first stage, inputting a first signal into the current limiter, such that the first signal has a current level limited into a first current limiting range; and at a second stage after a first preset time period elapses since the first signal is received via the input terminal of the current limiter, inputting a second signal into the current limiter, such that the second signal has a current level limited into a second current limiting range, wherein the second current limiting range is different from the first current limiting range.

In some embodiments, the second current limiting range has an upper limit and a lower limit which are higher than those of the first current limiting range. In some embodiments, the method further comprises: outputting, by the voltage protection module, a disable signal via its third terminal in response to detecting an over voltage event or under voltage event across its first and second terminals, such that the switch is switched off. In some embodiments, the method further comprises: outputting, by the voltage protection module, an enable signal via its third terminal in response to detecting the disappearance of the over voltage event or under voltage event, such that the switch is controlled by the range controlling module only. In some embodiments, the method further comprises: outputting, by the charging completion indicating module, a disable signal via its disable terminal after a second preset time period elapses since a second trigger signal is received via its input terminal, such that the switch is switched off.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and therefore are not to be considered limiting of its scope, the disclosure will be described with additional specificity and detail through use of the accompanying drawings.

FIG. 6 is a flow chart illustrating an exemplary method for operating a current limiter according to an embodiment of the present disclosure.

DETAILED DESCRIPTION

Figure 1:
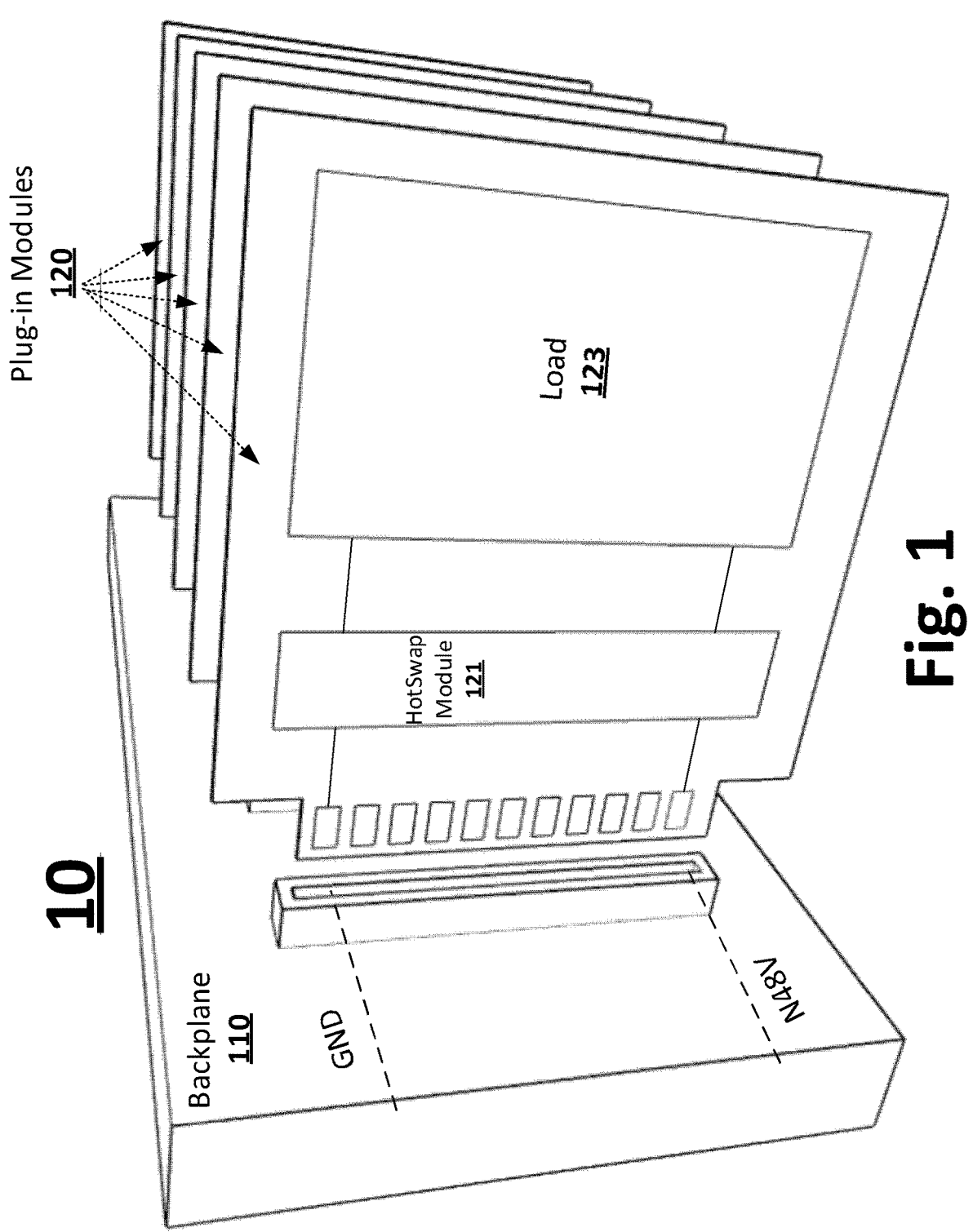
FIG. 1 is a block diagram illustrating an exemplary hot-swapping enabled system according to an embodiment of the present disclosure.

Hereinafter, the present disclosure is described with reference to embodiments shown in the attached drawings. However, it is to be understood that those descriptions are just provided for illustrative purpose, rather than limiting the present disclosure. Further, in the following, descriptions of known structures and techniques are omitted so as not to unnecessarily obscure the concept of the present disclosure.

Those skilled in the art will appreciate that the term "exemplary" is used herein to mean "illustrative," or "serving as an example," and is not intended to imply that a particular embodiment is preferred over another or that a particular feature is essential. Likewise, the terms "first" and "second," and similar terms, are used simply to distinguish one particular instance of an item or feature from another, and do not indicate a particular order or arrangement, unless the context clearly indicates otherwise. Further, the term "step," as used herein, is meant to be synonymous with "operation" or "action." Any description herein of a sequence of steps does not imply that these operations must be carried out in a particular order, or even that these operations are carried out in any order at all, unless the context or the details of the described operation clearly indicates otherwise.

The terminology used herein is for the purpose of describing particular embodiments only and is not intended to be liming of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof. It will be also understood that the terms "connect(s)," "connecting", "connected", etc. when used herein, just means that there is an electrical or communicative connection between two elements and they can be connected either directly or indirectly, unless explicitly stated to the contrary.

Conditional language used herein, such as "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below. In addition, language such as the phrase "at least one of X, Y and Z," unless specifically stated otherwise, is to be understood with the context as used in general to convey that an item, term, etc. may be either X, Y, or Z, or a combination thereof.

Of course, the present disclosure may be carried out in other specific ways than those herein set forth without departing from the scope and essential characteristics of the disclosure. One or more of the specific processes discussed below may be carried out in any communications transceiver comprising one or more appropriately configured processing circuits, which may in some embodiments be embodied in one or more application-specific integrated circuits (ASICs). In some embodiments, these processing circuits may comprise one or more microprocessors, microcontrollers, and/or digital signal processors programmed with appropriate software and/or firmware to carry out one or more of the operations described above, or variants thereof. In some embodiments, these processing circuits may comprise customized hardware to carry out one or more of the functions described above. The present embodiments are, therefore, to be considered in all respects as illustrative and not restrictive.

Although multiple embodiments of the present disclosure will be illustrated in the accompanying Drawings and described in the following Detailed Description, it should be understood that the disclosure is not limited to the described embodiments, but instead is also capable of numerous rearrangements, modifications, and substitutions without departing from the present disclosure that as will be set forth and defined within the claims.

Further, please note that although the following description of some embodiments of the present disclosure is given in the context of RF communication circuit, the present disclosure is not limited thereto.

FIG. 1 is a block diagram illustrating an exemplary hot-swapping enabled system according to an embodiment of the present disclosure. As shown in FIG. 1, the system 10 may comprise a −48 V (N48V) backplane and a rack of removable modules (or plug-in modules) 120. The −48 V approach originated in traditional telecommunications exchange system technology. Examples can be seen in Advanced Telecommunications Computing Architecture (ATCA) systems, optical networks, base stations, and blade servers. As a voltage commonly obtained from battery stacks, 48 V was chosen because power and signals could be transmitted over distance without significant losses, yet the level is not high enough to risk severe electric shock under ordinary conditions. Negative polarity was chosen because, in the inevitable presence of moisture when exposed to the elements, the migration of metallic ions from anode to cathode is far less corrosive with the positive terminal grounded. However, the present disclosure is not limited thereto. In some other embodiments, another voltage level may be used, for example, +12 V or any other appropriate voltage level.

Referring to FIG. 1, each module 120 may have the ability to be withdrawn and/or replaced without affecting the normal operation of any of the adjacent modules 120 in the rack. In the absence of a hotswap module, each of the modules 120 may present a considerable amount of load capacitance to the supply line, usually of the order of millifarads. When a module 120 is first inserted, its uncharged capacitors demand as much current as is available to charge up the load (e.g. a load 123). If this inrush current is not limited, it could reduce supply voltages, causing a significant brownout on the main backplane 110, resetting many of the adjacent modules 120 on the system 10, and damaging the modules' connectors due to the high initial current.

This can be resolved with a hotswap module 121, which carefully controls the inrush current to ensure a safe power-up interval. The hotswap module 121 may also continually monitor the supply current after power-up for protection against short circuits and overcurrent conditions during normal operation as will be described in details below.

As mentioned above, an inrush current of a switching mode hotswap module may be controlled by a current hysteresis circuit. To overcome or at least partially alleviate some of the defects of the existing current hotswap module (such as, those mentioned in the background section), a switching mode hotswap solution is proposed. This switching mode hotswap solution may have more than one current hysteresis working under different conditions. To be specific, during the power-up phase, the hotswap module may adopt a low current hysteresis to charge output bulk capacitors to constrain the inrush current, thereby solving the high inrush current issue. After the charging process is finished, the current hysteresis will be switched from low to high automatically, and the high current hysteresis may secure that the hotswap module will not be triggered under the full load and PLD (Power Line Disturbance) conditions. In this way, the hotswap solution according to some embodiments of the present disclosure may solve the high inrush current issue while having no influence under the normal working condition.

Next, the hotswap solution according to some embodiments of the present disclosure will be described in details with reference to FIG. 2-FIG. 6.

Figure 2:
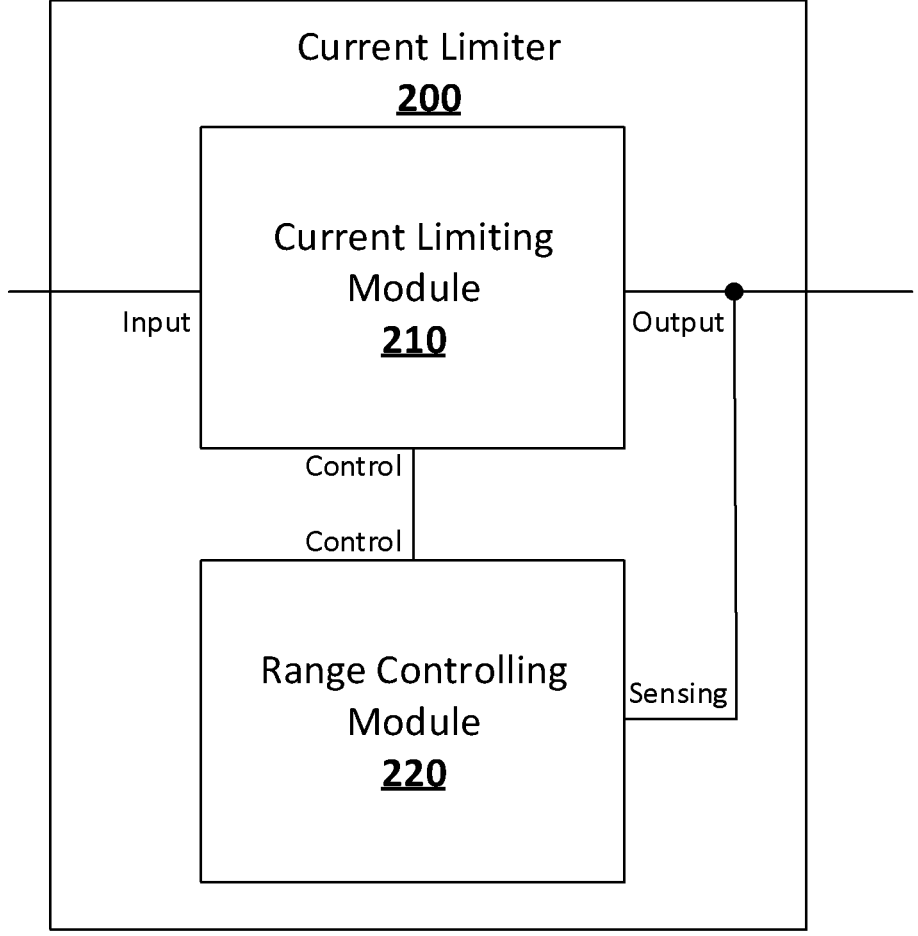
FIG. 2 is a block diagram illustrating an exemplary current limiter according to an embodiment of the present disclosure.

FIG. 2 is a block diagram illustrating an exemplary current limiter 200 according to an embodiment of the present disclosure. In some embodiments, the current limiter 200 may be a part of the hotswap module 121 shown in FIG. 1, and may function as a sub-circuit of the hotswap module 121 which provides the hot plug-in function.

As shown in FIG. 2, the current limiter 200 may comprise a current limiting module 210, which may have an input terminal, an output terminal, and a control terminal. The current limiting module 210 may be configured to limit a current, which is input via its input terminal, within a current limiting range.

For example, the current limiting module 210 may be a buck converter in some embodiments, and its switch may be controlled by the control terminal. With this configuration, the current output via the output terminal may be controlled to increase when the switch is closed (on-state) and to decrease when the switch is opened (off-state), and therefore the output current may be controlled within a current limiting range. Further, by adjusting the time points when the switch is switched on and off, different current limiting ranges may be achieved.

Referring to FIG. 2, the current limiter 200 may further comprise a range controlling module 220, which may have a control terminal and a sensing terminal. In some embodiments, the control terminal may be coupled to the control terminal of the current limiting module 210, and the sensing terminal may be coupled to the output terminal of the current limiting module 210. The range controlling module 220 may be configured to generate a control signal at least based on the current which is output via the output terminal of the current limiting module 210 and which is sensed at the sensing terminal of the range controlling module 220. Further, the range controlling module 220 may be further configured to output the control signal via its control terminal, such that the current limiting range may be dynamically adjustable based on the control signal.

There are multiple methods for sensing the current output by the current limiting module 210, for example, methods based on the Ohm's law, the Faraday's law of induction, magnetic field sensors, the Faraday effect, etc. For example, a shunt resistor may be connected to the output terminal of the current limiting module 210 in series, and the voltage drop across the shunt resistor may be sensed. In this way, the current flowing through the shunt resistor may be calculated based on its resistance and the voltage drop according to the Ohm's law. For another example, since a conductive wire or trace on a PCB board may have a resistance, and therefore it may be used as the shunt resistor. The current may be sensed according to the Ohm's law. For yet another example, a current transformer or a Rogowski coil may be used to sense the current output by the current limiting module 210 based on the Faraday's law of induction. Nevertheless, the present disclosure is not limited to the above methods for sensing the current.

Once the current is sensed, the control signal may be generated based on the sensed current. For example, when the sensed current has a level higher or equal to the upper limit of the current limiting range, then the control signal may be generated with a level which may switch the switch of the current limiting module 210 off, such that the current output by the current limiting module 210 may decrease. On the other hand, when the sensed current has a level lower or equal to the lower limit of the current limiting range, then the control signal may be generated with a level which may switch the switch of the current limiting module 210 on, such that the current output by the current limiting module 210 may increase. By the cooperation of the current limiting module 210 and the range controlling module 220, the current output by the current limiter 200 may be controlled within a current limiting range.

Further, the range controlling module 220 may dynamically adjust its timing of outputting the control signal, such that the current limiting range may be dynamically adjusted as required.

With this current limiter design, a hotswap module (e.g., the one shown in FIG. 1) may have more than one current hysteresis which may adjust power-up inrush current at an earlier stage with a low current hysteresis while still being able to operate normally at a later stage with a high current hysteresis. Further, such a design may minimize the possibility of site PSU over current protection triggered issue when powering up several plug-in modules simultaneously, and minimize the risk of the hotswap switching MOSFET burn during power-up such that final products may be more reliable and robust.

Next, a more specific embodiment of a current limiter will be described with reference to FIG. 3.

Figure 3:
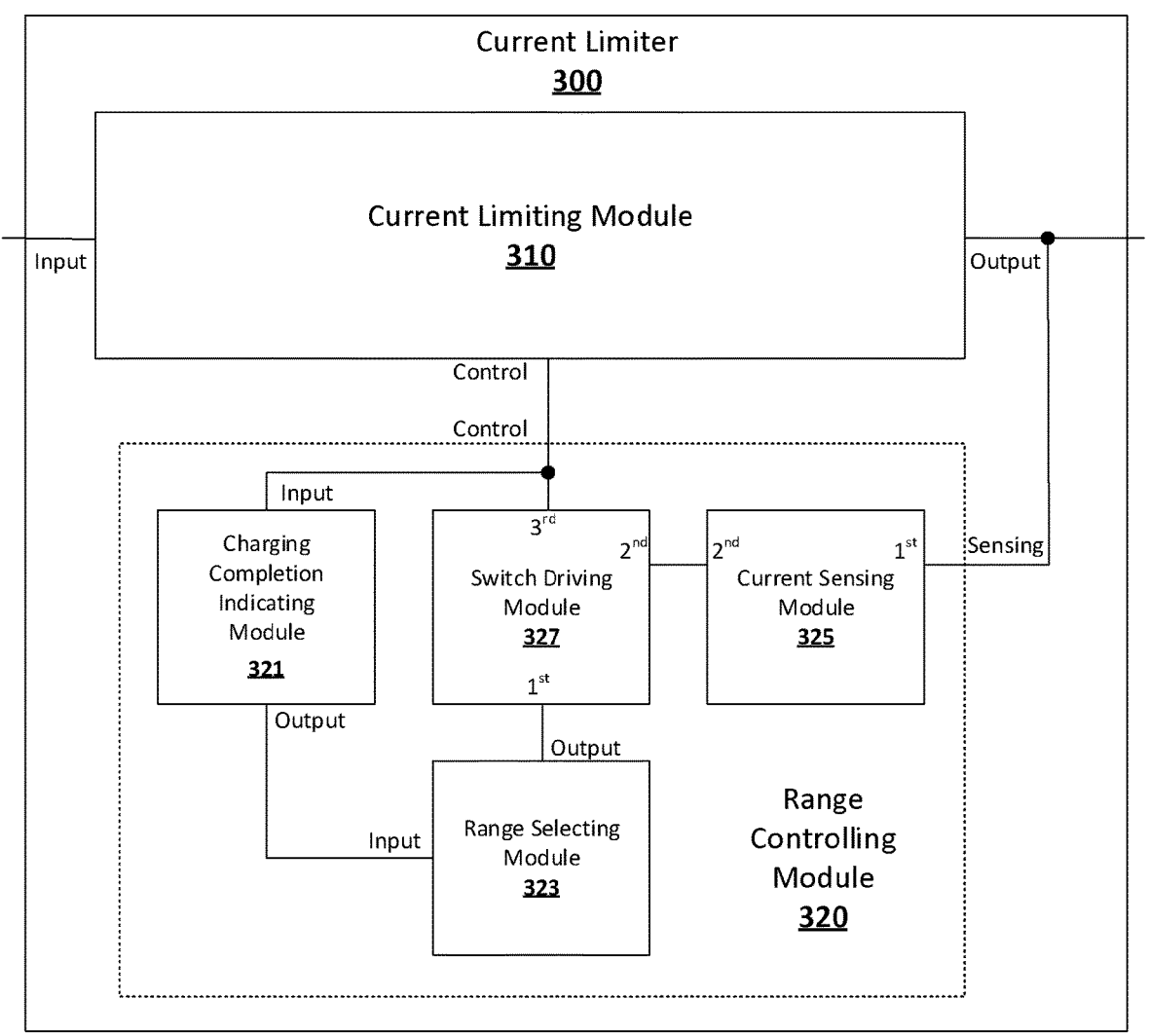
FIG. 3 is a block diagram illustrating another exemplary current limiter according to an embodiment of the present disclosure.

FIG. 3 is a block diagram illustrating another exemplary current limiter 300 according to an embodiment of the present disclosure. As shown in FIG. 3, the current limiter 300 may comprise a current limiting module 310 and a range controlling module 320, which may be similar to the current limiting module 210 and the range controlling module 220, respectively, with the exception that a detailed structure of the range controlling module 320 is shown. In other words, the range controlling module 320 is a possible implementation of the range controlling module 220. Therefore, a detailed description of the current limiting module 310 is omitted for simplicity.

Referring to FIG. 3, the range controlling module 320 may comprise a charging completion indicating module 321, a range selecting module 323, a current sensing module 325, and a switch driving module 327.

As shown in FIG. 3, the charging completion indicating module 321 may have an input terminal and an output terminal, and be configured to output a charging completion indicating signal via the output terminal after a first preset time period elapses since a first trigger signal is received via the input terminal. With this configuration, the charging completion indicating signal may be used to distinguish from different stages during which different current hysteresis may be used. For example, before the charging completion indicating signal is output, the range controlling module 320 may be operated in a low current hysteresis mode, and after the charging completion indicating signal is output, the range controlling module 320 may be operated in a high current hysteresis mode. However, the present disclosure is not limited thereto. For example, in some other embodiments, the charging completion indicating module 321 may output multiple signals indicative of more than two stages.

Further, as shown in FIG. 3, the input terminal of the charging completion indicating module 321 may be coupled to a third terminal of the switch driving module 327. In some embodiments, the first trigger signal may be the last ON signal input into the control terminal of the current limiting module 310 after which no OFF signal is input into the control terminal of the current limiting module 310 until the expiration of the first preset time period. For example, the first trigger signal may be the last rising edge of the signal in the row "P2", which is immediately followed by the "10 ms" interval, shown in FIG. 5. In some embodiments, the first preset time period may be 10 ms. However, please note that "10 ms" is merely an example of the first preset time period, and any other appropriate time period, during which the capacitors in the current limiter 300 may be fully charged, can be used. Further, please note that the first trigger signal is not limited to the signal output via the third terminal of the switch driving module 327. In some other embodiments, the first trigger signal may be any other appropriate signal.

Referring back to FIG. 3, the range selecting module 323 may have an input terminal coupled to the output terminal of the charging completion indicating module 321 and an output terminal, and be configured to initially output a first range selection signal via its output terminal, and output a second range selection signal via its output terminal when the charging completion indicating signal is received via its input terminal. In some embodiments, the second range selection signal may be associated with a different current limiting range than that associated with the first range selection signal. With this range selecting module 323, different current limiting ranges (or different current hysteresis modes) may be selected, for example, based on the output of the charging completion indicating module 321. However, the present disclosure is not limited thereto. In some other embodiments, the range selecting module 323 may output different range selection signals based on other criteria.

Further, the current sensing module 325 may have a first terminal serving as the sensing terminal of the range controlling module 320 and a second terminal, and be configured to sense the current at its first terminal and output a sensing signal indicative of the sensed current via its second terminal. With the current sensing module 325, the range controlling module 320 may sense the output current from the current limiting module 310 in a similar manner to that shown in FIG. 2.

Further, the switch driving module 327 may have a first terminal coupled to the output terminal of the range selecting module 323, a second terminal coupled to the second terminal of the current sensing module 325, and the third terminal serving as the control terminal of the range controlling module 320, and be configured to output the control signal based on the signals received at the first terminal and the second terminal. With this switch driving module 327, the range controlling module 320 may generate different control signals based on the current limiting range (or the current hysteresis mode) selected by the range selecting module 323 and the current sensed by the current sensing module 325, and the control signals may be used to control the current limiting module 310, thereby achieving the multi-current-hysteresis solution.

In some embodiments, for example, some embodiments where N-type MOSFETs are used as the switches, the charging completion indicating signal may be a high level voltage signal, the first range selection signal may be a low level voltage signal, and the second range selection signal may be a high level voltage signal. In some embodiments, the sensing signal may be a voltage signal having a level indicative of the current sensed at the first terminal of the current sensing module 325. However, the present disclosure is not limited thereto. For example, with P-type transistors, an active low signal is required instead of an active high signal, and therefore, in such cases, the charging completion indicating signal may be a low level voltage signal, the first range selection signal may be a high level voltage signal, and the second range selection signal may be a low level voltage signal. Further, in some other embodiments where N-type MOSFETs and P-type MOSFETs are used in a mixed manner, some of the signals may be active high signals, and rest of them may be active low signals, and therefore the present disclosure is not limited thereto.

With the above configuration, the current limiter 300 may achieve a similar technical effect as the current limiter 200. Therefore, a hotswap module (e.g., the one shown in FIG. 1) may have more than one current hysteresis which may adjust power-up inrush current at an earlier stage with a low current hysteresis while still being able to operate normally at a later stage with a high current hysteresis. Further, such a design may minimize the possibility of site PSU over current protection triggered issue when powering up several plug-in modules simultaneously, and minimize the risk of the hotswap switching MOSFET burn during power-up such that final products may be more reliable and robust.

Next, an even more specific embodiment of a current limiter will be described with reference to FIG. 4.

Figure 4:
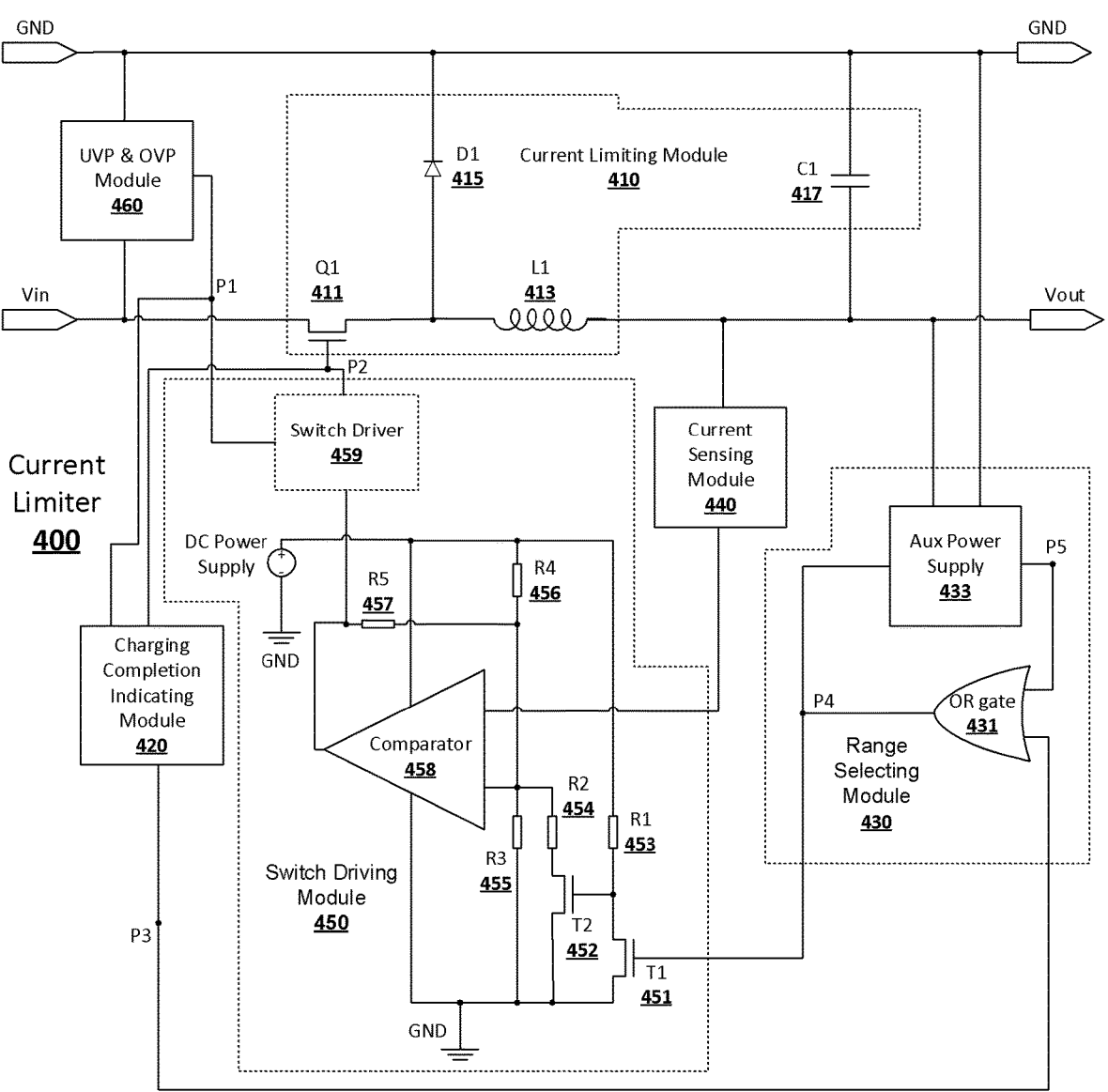
FIG. 4 is a block diagram illustrating yet another exemplary current limiter according to an embodiment of the present disclosure.

FIG. 4 is a block diagram illustrating yet another exemplary current limiter 400 according to an embodiment of the present disclosure. As shown in FIG. 4, the current limiter 400 may comprise a current limiting module 410 and a range controlling module, which may be similar to the current limiting module 210/310 and the range controlling module 220/320, respectively, with the exception that detailed structures of the current limiting module 410 and the range controlling module are shown. In other words, the current limiting module 410 is a possible implementation of the current limiting module 210 and/or 310, and the range controlling module 420 is a possible implementation of the range controlling module 220 and/or 320.

As shown in FIG. 4, the current limiting module 410 may comprise a switch (Q1) 411, an inductor (L1) 413, and a diode (D1) 415. In some embodiments, the switch 411 may have a first terminal serving as the input terminal of the current limiting module 410, a second terminal, and a control terminal serving as the control terminal of the current limiting module 410, and be configured to be switched on or off in response to an ON or OFF signal (i.e. the control signal) input via the control terminal. Further, the inductor 413 may have a first terminal coupled to the second terminal of the switch 411 and a second terminal serving as the output terminal of the current limiting module 410. Further, the diode 415 may have a first terminal coupled to the second terminal of the switch 411 and a second terminal being grounded, wherein the forward direction of the diode 415 may be from the first terminal to the second terminal. Further, the current limiting module 410 may optionally further comprise a capacitor 417, which may have a first terminal coupled to the second terminal of the inductor 413 and a second terminal being grounded. Further, there may be more than one capacitor 417 in the current limiting module 410.

With this configuration, the switch 411, the inductor 413, the diode 415, and the optional capacitor 417 may constitute a buck converter, which may be controlled by the control signal received via the control terminal of the switch 411. The current limiting module 410 may be operated in a similar manner to the current limiting module 210 and/or the current limiting module 310 shown in FIG. 2 and FIG. 3, respectively.

To be specific, the current limiting module 410 may be best understood in terms of the relation between current and voltage of the inductor 413. Beginning with the switch 411 open (off-state), the current in the current limiting module 410 is zero. When the switch 411 is first closed (on-state), the current will begin to increase, and the inductor 413 will produce an opposing voltage across its terminals in response to the changing current. This voltage drop counteracts the voltage of the source (i.e. the voltage across the Vin terminal (e.g., −48 V) and the GND terminal) and therefore reduces the net voltage across the load (e.g. a load that may be connected across the GND terminal and the Vout terminal). Over time, the rate of change of current decreases, and the voltage across the inductor 413 also then decreases, increasing the voltage at the load. During this time, the inductor stores energy in the form of a magnetic field. If the switch 411 is opened while the current is still changing, then there will always be a voltage drop across the inductor 413, so the net voltage at the load (e.g. Vout) will always be less than the input voltage source (e.g. Vin). When the switch 411 is opened again (off-state), the voltage source will be removed from the circuit, and the current will decrease. The decreasing current will produce a voltage drop across the inductor 413 (opposite to the drop at on-state), and now the inductor 413 becomes a current source. The stored energy in the inductor 413's magnetic field supports the current flow through the load. This current, flowing while the input voltage source is disconnected, when concatenated with the current flowing during on-state, totals to current greater than the average input current (being zero during off-state). The "increase" in average current makes up for the reduction in voltage, and ideally preserves the power provided to the load. During the off-state, the inductor 413 is discharging its stored energy into the rest of the circuit. If the switch 411 is closed again before the inductor 413 fully discharges (on-state), the voltage at the load will always be greater than zero. In other words, the current limiting module 410 may limit its output current within a specified current limiting range based on the timings for switching the switch 411 on and off.

In some embodiments, the switch 411 may be a metal oxide semiconductor field effect transistor, MOSFET, and the first terminal of the MOSFET 411 may be one of its source and drain, the second terminal of the MOSFET 411 may be the other of its source and drain, and the control terminal of the MOSFET 411 may be its gate. In some embodiments, the MOSFET 411 may be an N-type MOS-FET 411, that is, the ON signal is a high level voltage signal and the OFF signal is a low level voltage signal. However, the present disclosure is not limited thereto. For example, in some other embodiments, the switch 411 may be a P-type MOSFET and an active low voltage signal may be used.

Similar to the charging completion indicating module 321, the charging completion indicating module 420 may have an input terminal and an output terminal, and be configured to output a charging completion indicating signal (at the reference point P3) via the output terminal after a first preset time period elapses since a first trigger signal is received via the input terminal. With this configuration, the charging completion indicating signal may be used to distinguish from different stages during which different current hysteresis may be used. For example, before the charging completion indicating signal is output, the range controlling module shown in FIG. 4 may be operated in a low current hysteresis mode, and after the charging completion indicating signal is output, the range controlling module may be operated in a high current hysteresis mode. However, the present disclosure is not limited thereto. For example, in some other embodiments, the charging completion indicating module 420 may output multiple signals indicative of two or more stages, respectively.

Further, the input terminal of the charging completion indicating module 421 may be coupled to the third terminal of the switch driving module 450 (or the reference point P2). In some embodiments, the first trigger signal may be the last ON signal input into the control terminal of the current limiting module 410 or the control terminal of the switch 411 after which no OFF signal is input into the control terminal of the current limiting module 410 or the control terminal of the switch 411 until the expiration of the first preset time period. For example, the first trigger signal may be the last rising edge of the signal in the row "P2", which is immediately followed by the "10 ms" interval, shown in FIG. 5. In some embodiments, the first preset time period may be 10 ms. However, please note that "10 ms" is merely an example of the first preset time, and any appropriate time period, during which the capacitors in the current limiter 400 may be fully charged, can be used. Further, please note that the first trigger signal is not limited to the signal at P2. In some other embodiments, the first trigger signal may be any other appropriate signal.

As shown in FIG. 4, the range selecting module 430 may comprise an OR gate 431 and an auxiliary power supply 433. The OR gate 431 may have a first input terminal serving as the input terminal of the range selecting module 430, a second input terminal, and a third output terminal serving as the output terminal of the range selecting module 430, and be configured to perform an logical OR operation on the inputs from the first and second input terminals and output a signal indicative of the result of the logical OR operation via the third output terminal. The auxiliary power supply 433 may have a first terminal coupled to the third output terminal of the OR gate 431, a second terminal coupled to the output terminal of the current limiting module 410, a third terminal coupled to the ground, and a fourth terminal coupled to the second input terminal of the OR gate 431, and be configured to output an auxiliary power OK signal (at the reference point P5) via the fourth terminal after an auxiliary power enable signal (at the reference point P4) is received via the first terminal. In some embodiments, the auxiliary power OK signal and/or the auxiliary power enable signal may be high level voltage signals.

With this configuration, once the charging completion indicating signal is received by the OR gate 431, the OR gate 431 may output the auxiliary power enable signal to the auxiliary power supply 433 to enable the auxiliary power supply 433, which in turn outputs the auxiliary power OK signal to the OR gate 431. In this way, the range selecting module 430 may become a self-lock logic, and therefore the high hysteresis will be used after the capacitor is fully charged (which is guaranteed by the first preset time period) until the whole module is powered off or restarted.

Further, in some embodiments, the auxiliary power supply 433 may generate several power rails to supply other modules, such as, MOSFET drivers, Low Dropout (LDO) regulators, and logical components, etc.

As shown in FIG. 4, the current sensing module 440 may be operated in a similar manner to the current sensing module 325. To be specific, the current sensing module 440 may have a first terminal serving as the sensing terminal of the range controlling module shown in FIG. 4 and a second terminal, and be configured to sense the current at its first terminal and output a sensing signal indicative of the sensed current via its second terminal. With the current sensing module 440, the range controlling module may sense the output current from the current limiting module 410 in a similar manner to those shown in FIG. 2 and FIG. 3.

Referring to FIG. 4 again, the switch driving module 450 may comprise a range signal processing module and a comparator 458. As shown in FIG. 4, the range signal processing module may be composed of multiple elements, such as transistors and resistors. The range signal processing module may have an input terminal coupled to the output terminal of the range selecting module 430 and an output terminal, and be configured to output a reference signal via the output terminal which is dynamically determined based on the signal received via the input terminal of the range signal processing module. The comparator 458 may have a first input terminal coupled to the output terminal of the range signal processing module, a second input terminal coupled to the second terminal of the current sensing module 440, and an output terminal serving as the third terminal of the switch driving module 450, and be configured to output the control signal via the output terminal based on the comparison of the reference signal and the sensing signal received via the first input terminal and the second input terminal, respectively.

With this configuration, the switch driving module 450 may generate different control signals based on the current limiting range (or the current hysteresis mode) selected by the range selecting module 430 and the current sensed by the current sensing module 440, and the control signals may be used to control the current limiting module 410, thereby achieving the multi-current-hysteresis solution.

As shown in FIG. 4, the range signal processing module may comprise two transistors, T1 and T2, and five resistors, R1-R5. The first transistor, T1, 451 may have a first terminal, a second terminal coupled to the ground, and a control terminal serving as the input terminal of the range signal processing module. The second transistor, T2, 452 may have a first terminal, a second terminal coupled to the ground, and a control terminal coupled to the first terminal of T1 451. The first resistor, R1, 453 may have a first terminal coupled to a direct current (DC) power supply and a second terminal coupled to the first terminal of T1 451. The second resistor, R2, 454 may have a first terminal coupled to the first input terminal of the comparator 458 and a second terminal coupled to the first terminal of T2 452. The third resistor, R3, 455 may have a first terminal coupled to the first input terminal of the comparator 458 and a second terminal coupled to the ground. The fourth resistor, R4, 456 may have a first terminal coupled to the DC power supply and a second terminal coupled to the first input terminal of the comparator 458. The fifth resistor, R5, 457 may have a first terminal coupled to the output terminal of the comparator 458 and a second terminal coupled to the first input terminal of the comparator 458.

With this configuration, the comparator 458 may compare the sensing signal provided from the current sensing module 440 with a dynamically changing reference voltage, and then output the control signals which may be associated with different current limiting ranges.

For example, when the range selecting module 430 outputs a low level voltage signal indicating a low hysteresis, T1 451 may be switched off, and therefore T2 452 may be switched on due to the high voltage applied from the DC power supply. In this case, the R2 454 and R3 455 are connected in parallel, resulting a lower equivalent resistance, and the voltage at the first input terminal of the comparator 458 may be lower due to a lower equivalent resistance of R2 454 and R3 455 in view of R4 456. On the other hand, when the range selecting module 430 outputs a high level voltage signal indicating a high hysteresis, T1 451 may be switched on, and therefore the control terminal of T2 452 may be grounded and T2 452 is switched off. In this case, R2 454 is no longer connected with R3 455 in parallel, and the voltage at the first input terminal of the comparator 458 may be higher due to a higher equivalent resistance of R2 454 and R3 455 than they were in the low hysteresis mode.

In other words, by comparing the sensing signal which is indicative of the current sensed at the output terminal of the current limiting module 410 with a reference signal which may be dynamically changed by the range selecting module 430, a dynamically adjustable current limiting range may be achieved. For example, in the embodiment of the FIG. 4, a low hysteresis may be used until the charging completion indicating signal is issued by the charging completion indicating module 420, after which a high hysteresis may be used. In this way, the current limiter 400 may achieve a similar technical effect as the current limiters 200 and/or 300. Therefore, a hotswap module (e.g., the one shown in FIG. 1) may have more than one current hysteresis which may adjust power-up inrush current at an earlier stage with a low current hysteresis while still being able to operate normally at a later stage with a high current hysteresis. Further, such a design may minimize the possibility of site PSU over current protection triggered issue when powering up several plug-in modules simultaneously, and minimize the risk of the hotswap switching MOSFET burn during power-up such that final products may be more reliable and robust.

Further, in some embodiments, the current limiter 400 may optionally further comprise a voltage protection module 460. The voltage protection module 460 may have a first terminal coupled to the input terminal of the current limiting module 410, a second terminal coupled to the ground, and a third terminal coupled to an enable terminal of the range controlling module, and be configured to output an enable signal via the third terminal when a voltage detected across its first terminal and its second terminal is within a safe range. In some embodiments, the enable signal may be a high level voltage signal.

Accordingly, the switch driving module 450 may further comprise an optional switch driver 459. The switch driver 459 may have a first terminal coupled to the output terminal of the comparator 458, and a second terminal (instead of the output terminal of the comparator 458) serving as the third terminal of the switch driving module 450, and a third terminal serving as the enable terminal of the range controlling module, and be configured to output the control signal only when the enable signal is received at its third terminal.

Further, the charging completion indicating module 420 may further comprise a disable terminal coupled to the enable terminal of the switch driver 459, and further be configured to output a disable signal via the disable terminal after a second preset time period elapses since a second trigger signal is received via the input terminal. In some embodiments, the disable signal may be a low level voltage signal, which is capable of overriding the enable signal output from the voltage protection module 460. In some embodiments, the input terminal of the charging completion indicating module 420 may be coupled to the third terminal of the switch driving module 450, and the second trigger signal may be the first ON signal input into the control terminal of the current limiting module 410 after the enable signal is changed from a low level voltage signal to a high level voltage signal, and the second preset time period may be 250 ms. Please note that, 250 ms is merely an example of the second preset time period, and the present disclosure is not limited thereto.

With this configuration, the current limiter 400 may further provide an over-voltage/under-voltage protection function. For example, when an under-voltage or over-voltage condition is detected across the Vin terminal and the GND terminal, no enable signal is output, and therefore the switch driver 459 may output a control signal which switches the switch 411 off to protect the current limiter 400 from any damage caused by the under-voltage/over-voltage condition. Further, when the charging completion indicating module 420 detects an over charging event, for example, by detecting the high level signals at P2 for a second preset time period (e.g., that shown in FIG. 5), a disable signal may be provided to the switch driver 459 to switch off the switch 411, such that no further charging is allowed, and the circuit is protected.

Next, a detailed description of how to operate the current limiter 400 will be given with reference to the timing diagram of FIG. 5.

Figure 5:
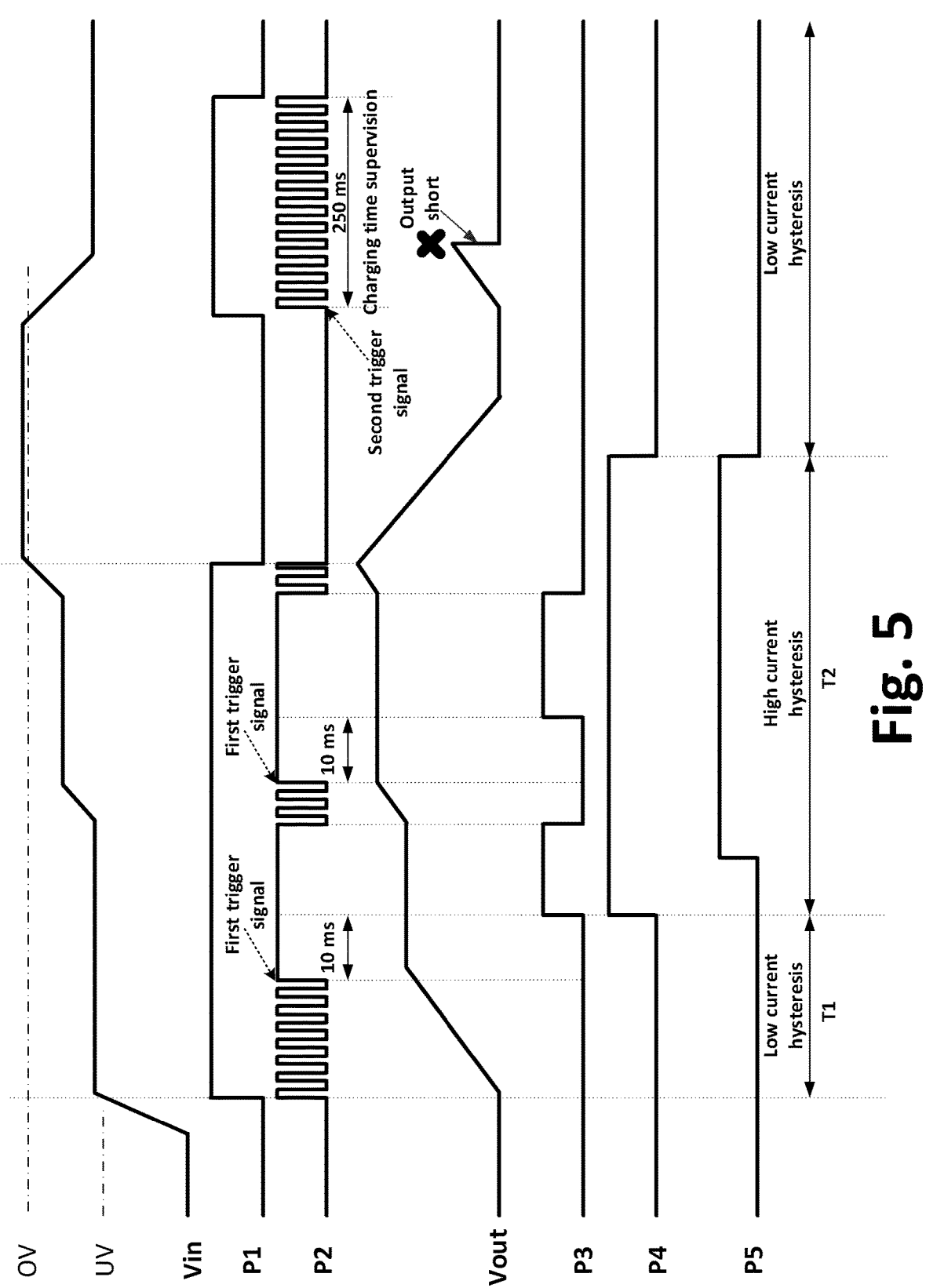
FIG. 5 is a timing diagram illustrating how to operate a current limiter of FIG. 4 according to an embodiment of the present disclosure.

FIG. 5 is a timing diagram illustrating how to operate the current limiter 400 of FIG. 4 according to an embodiment of the present disclosure. As shown in FIG. 5, signals at different points of the current limiter 400 are shown, for example, Vin, P1, P2, P3, P4, P5, and Vout. Further, the reference symbols OV and UV indicate an over-voltage level and an under-voltage level for the Vin signal, respectively.

As shown in FIG. 5, the current limiter 400 is powered up, and the Vin increases gradually. Before the Vin becomes higher than or equal to the under-voltage level, the voltage protection module 460 will output a low level signal as shown in the row "P1", and therefore the switch driver 459 will control the switch 411 in an OFF state, and therefore no current flows in the current limiting module 410.

After that, at a first stage T1, the voltage protection module 460 will output the enable signal because the input voltage is between the under voltage and the over voltage, and the switch driver 459 may function based on the comparison between the sensed current and the adjustable reference voltage, which is currently in the low hysteresis mode because the charging completion indicating module 420 has not issue the charging completion indicating signal yet, as shown in the row "P3". Therefore, at the first stage T1, a first signal may be input into the current limiter 400, such that the first signal has a current level limited into a first current limiting range, for example, a range corresponding to the low hysteresis mode.

When a trigger signal, for example, the last rising edge of the signal of the row "P2", which is immediately followed by the "10 ms" interval, is output from the switch driver 459 to the charging completion indicating module 420, the charging completion indicating module 420 may set a timer with an expiration time of the first preset time period (e.g. 10 ms shown in FIG. 5). When the timer expires, which means the capacitor is fully charged and a high hysteresis mode should be started, the charging completion indicating module 420 outputs the charging completion indicating signal to the range selecting module 430, and changes the reference voltage at the first input terminal of the comparator 458, and finally changing the hysteresis mode from low to high, as shown in the rows of "P3" and "P4".

Therefore, at a second stage after the first preset time period elapses since the first signal is received via the input terminal of the current limiter 400, a second signal is input into the current limiter 400, such that the second signal has a current level limited into a second current limiting range which is different from the first current limiting range. For example, the second current limiting range may be associated with the high hysteresis mode, and the first current limiting range may be associated with the low hysteresis mode. In some embodiments, the second current limiting range may have an upper limit and a lower limit which are higher than those of the first current limiting range. After the hysteresis mode is changed from low to high, a higher voltage signal can be observed in the row "Vout".

Further, as also shown in FIG. 5, when the Vin signal goes beyond the over-voltage level, the voltage protection module 460 may output a low level voltage signal, as shown in the row "P1", which makes the switch driver 459 turn the switch 411 off, and the output voltage is decreased as shown in the row "Vout". In other words, the voltage protection module 460 may output a disable signal via its third terminal in response to detecting an over voltage event or under voltage event across its first and second terminals, such that the switch 411 is switched off.

Later, when the input voltage "Vin" comes back to the normal range between the UV and OV levels, the voltage protection module 460 may output an enable signal again via its third terminal in response to detecting the disappearance of the over voltage event or under voltage event, such that the switch 411 is controlled by the range controlling module only. In other words, the switch 411 may be turned on or off based on the comparison between the sensing signal from the current sensing module 440 and the reference voltage in the current hysteresis mode.

Further, as also shown in FIG. 5, when a short condition is detected on the load side, for example, between the terminals "GND" and "Vout", as shown by "output short" in FIG. 5, the output voltage Vout will decrease to zero, and the capacitor 417 will never be fully charged and the charging completion indicating module 420 will never receive its trigger signal and therefore the switch driver 459 will never be disabled and will keep working for an indefinite time, as shown in the row "P2". In such a case, the charging completion indicating module 420 may output a disable signal via its disable terminal after a second preset time period elapses since a second trigger signal is received via its input terminal, such that the switch 411 may be switched off and the current limiter 400 may be placed in a latch mode or hiccup mode. In some embodiments, the second trigger signal may be the first ON signal input into the control terminal of the current limiting module after the enable signal is changed from a low level voltage signal to a high level voltage signal. In some embodiments, the second preset time period may be 250 ms, for example, as shown in FIG. 5. However, the present disclosure is not limited thereto, the second preset time period may be a time period of an appropriate time length.

FIG. 6 is a flow chart illustrating an exemplary method 600 for operating a current limiter according to an embodiment of the present disclosure.

FIG. 6 is a flow chart of an exemplary method 600 at a current limiter (e.g. the current limiter 200, 300, or 400) according to an embodiment of the present disclosure. The method 600 may comprise step S610 and Step S620. However, the present disclosure is not limited thereto. In some other embodiments, the method 600 may comprise more steps, less steps, different steps, or any combination thereof. Further the steps of the method 600 may be performed in a different order than that described herein. Further, in some embodiments, a step in the method 600 may be split into multiple sub-steps and performed by different entities, and/ or multiple steps in the method 600 may be combined into a single step. In some embodiments, the method 600 may be performed by the current limiter itself, a hotswap module comprising the current limiter, a plug-in module comprising the hotswap module, a backplane into which the plug-in module is plugged, or any other device electrically coupled to the current limiter. For example, when a plug-in module comprising the current limiter is being tested before delivered to its customer, the method 600 may be performed by a tester device coupled to the plug-in module indirectly by controlling the backplane to provide the plug-in module and thus the current limiter with appropriate input signals.

The method 600 may begin at step S610 where, at a first stage, a first signal may be input into the current limiter, such that the first signal has a current level limited into a first current limiting range.

At step S620, at a second stage after a first preset time period elapses since the first signal is received via the input terminal of the current limiter, a second signal may be input into the current limiter, such that the second signal has a current level limited into a second current limiting range, wherein the second current limiting range may be different from the first current limiting range.

In some embodiments, the second current limiting range may have an upper limit and a lower limit which are higher than those of the first current limiting range. In some embodiments, the method may further comprise: outputting, by the voltage protection module, a disable signal via its third terminal in response to detecting an over voltage event or under voltage event across its first and second terminals, such that the switch is switched off. In some embodiments, the method may further comprise: outputting, by the voltage protection module, an enable signal via its third terminal in response to detecting the disappearance of the over voltage event or under voltage event, such that the switch is controlled by the range controlling module only. In some embodiments, the method may further comprise: outputting, by the charging completion indicating module, a disable signal via its disable terminal after a second preset time period elapses since a second trigger signal is received via its input terminal, such that the switch is switched off.

With this method of operating a current limiter, a hotswap module (e.g., the one shown in FIG. 1) may be operated in more than one current hysteresis mode which may adjust power-up inrush current at an earlier stage with a low current hysteresis while still being able to operate normally at a later stage with a high current hysteresis. Further, such a design may minimize the possibility of site PSU over current protection triggered issue when powering up several plug-in modules simultaneously, and minimize the risk of the hotswap switching MOSFET burn during power-up such that final products may be more reliable and robust.

The disclosure has been described with reference to embodiments and drawings. It should be understood that various modifications, alternations and additions can be made by those skilled in the art without departing from the spirits and scope of the disclosure. Therefore, the scope of the disclosure is not limited to the above particular embodiments but only defined by the claims as attached and equivalents thereof.

What is claimed is:

1. A current limiter comprising:
a current limiting module having an input terminal, an output terminal, and a control terminal, and configured to limit a current, which is input via its input terminal, within a current limiting range; and
a range controlling module having a control terminal coupled to the control terminal of the current limiting module and a sensing terminal coupled to the output terminal of the current limiting module, and configured to generate a control signal at least based on the current which is output via the output terminal of the current limiting module and which is sensed at the sensing terminal, and output the control signal via its control terminal, such that the current limiting range is dynamically adjustable based on the control signal, wherein the range controlling module comprises:
a charging completion indicating module having an input terminal for receiving at least a first trigger signal and an output terminal, and configured to output a charging completion indicating signal via the output terminal after a first preset time period elapses since the first trigger signal is received via the input terminal; and
a range selecting module having an input terminal coupled to the output terminal of the charging completion indicating module and an output terminal, and configured to initially output a first range selection signal via its output terminal, and output a second range selection signal via its output terminal when the charging completion indicating signal is received via its input terminal, the second range selection signal being associated with a different current limiting range than that associated with the first range selection signal.

2. The current limiter of claim 1, wherein the current limiting module comprises:
a switch having a first terminal serving as the input terminal of the current limiting module, a second terminal, and a control terminal serving as the control terminal of the current limiting module, and configured to be switched on or off in response to an ON or OFF signal input via the control terminal;

an inductor having a first terminal coupled to the second terminal of the switch and a second terminal serving as the output terminal of the current limiting module; and
a diode having a first terminal coupled to the second terminal of the switch and a second terminal being grounded, wherein the forward direction of the diode is from the first terminal to the second terminal.

3. The current limiter of claim 2, wherein the switch is a metal oxide semiconductor field effect transistor, MOSFET, wherein the first terminal of the MOSFET is one of its source and drain, the second terminal of the MOSFET is the other of its source and drain, and the control terminal of the MOSFET is its gate.

4. The current limiter of claim 3, wherein the MOSFET is an N-type MOSFET,
wherein the ON signal is a high level voltage signal and the OFF signal is a low level voltage signal.

5. The current limiter of claim 2, wherein the current limiting module further comprises:
a capacitor having a first terminal coupled to the second terminal of the inductor and a second terminal being grounded.

6. The current limiter of claim 1, wherein the range controlling module further comprises:
a current sensing module having a first terminal serving as the sensing terminal of the range controlling module and a second terminal, and configured to sense the current at its first terminal and output a sensing signal indicative of the sensed current via its second terminal; and
a switch driving module having a first terminal coupled to the output terminal of range selecting module, a second terminal coupled to the second terminal of the current sensing module, and a third terminal serving as the control terminal of the range controlling module, and configured to output the control signal based on the signals received at the first terminal and the second terminal.

7. The current limiter of claim 6, wherein the input terminal of the charging completion indicating module is coupled to the third terminal of the switch driving module, wherein the first trigger signal is the last ON signal input into the control terminal of the current limiting module after which no OFF signal is input into the control terminal of the current limiting module until the expiration of the first preset time period, and wherein the first preset time period is 10 ms.

8. The current limiter of claim 6, wherein the charging completion indicating signal is a high level voltage signal, the first range selection signal is a low level voltage signal, and the second range selection signal is a high level voltage signal.

9. The current limiter of claim 6, wherein the sensing signal is a voltage signal having a level indicative of the current sensed at the first terminal of the current sensing module.

10. The current limiter of claim 6, wherein the range selecting module comprises:
an OR gate having a first input terminal serving as the input terminal of the range selecting module, a second input terminal, and a third output terminal serving as the output terminal of the range selecting module, and configured to perform an logical OR operation on the inputs from the first and second input terminals and output a signal indicative of the result of the logical OR operation via the third output terminal; and an auxiliary power supply having a first terminal coupled to the third output terminal of the OR gate, a second terminal coupled to the output terminal of the current limiting module, a third terminal coupled to the ground, and a fourth terminal coupled to the second input terminal of the OR gate, and configured to output an auxiliary power OK signal via the fourth terminal after an auxiliary power enable signal is received via the first terminal.

11. The current limiter of claim 10, wherein each of the auxiliary power OK signal and the auxiliary power enable signal is a high level voltage signal.

12. The current limiter of claim 6, wherein the switch driving module comprises:

a range signal processing module having an input terminal coupled to the output terminal of the range selecting module and an output terminal, and configured to output a reference signal via the output terminal which is dynamically determined based on the signal received via the input terminal; and a comparator having a first input terminal coupled to the output terminal of the range signal processing module, a second input terminal coupled to the second terminal of the current sensing module, and an output terminal serving as the third terminal of the switch driving module, and configured to output the control signal via the output terminal based on the comparison of the reference signal and the sensing signal received via the first input terminal and the second input terminal, respectively.

13. The current limiter of claim 12, wherein the range signal processing module comprises:

a first transistor having a first terminal, a second terminal coupled to the ground, and a control terminal serving as the input terminal of the range signal processing module;

a second transistor having a first terminal, a second terminal coupled to the ground, and a control terminal coupled to the first terminal of the first transistor;

a first resistor having a first terminal coupled to a direct current (DC) power supply and a second terminal coupled to the first terminal of the first transistor;

a second resistor having a first terminal coupled to the first input terminal of the comparator and a second terminal coupled to the first terminal of the second transistor;

a third resistor having a first terminal coupled to the first input terminal of the comparator and a second terminal coupled to the ground;

a fourth resistor having a first terminal coupled to the DC power supply and a second terminal coupled to the first input terminal of the comparator; and a fifth resistor having a first terminal coupled to the output terminal of the comparator and a second terminal coupled to the first input terminal of the comparator.

14. The current limiter of claim 6, wherein the range controlling module further comprises an enable terminal, wherein the current limiter further comprises a voltage protection module having a first terminal coupled to the input terminal of the current limiting module, a second terminal coupled to the ground, and a third terminal coupled to the enable terminal of the range controlling module, and configured to output an enable signal via the third terminal when a voltage detected across its first terminal and its second terminal is within a safe range.

15. The current limiter of claim 14, wherein the enable signal is a high level voltage signal.

16. The current limiter of claim 15, wherein the switch driving module comprises:

a range signal processing module having an input terminal coupled to the output terminal of the range selecting module and an output terminal, and configured to output a reference signal via the output terminal which is dynamically determined based on the signal received via the input terminal;

a comparator having a first input terminal coupled to the output terminal of the range signal processing module, a second input terminal coupled to the second terminal of the current sensing module, and an output terminal, and configured to output the control signal via the output terminal based on the comparison of the reference signal and the sensing signal received via the first input terminal and the second input terminal, respectively; and a switch driver having a first terminal coupled to the output terminal of the comparator, and a second terminal serving as the third terminal of the switch driving module, and a third terminal serving as the enable terminal of the range controlling module, and configured to output the control signal only when the enable signal is received at its third terminal.

17. The current limiter of claim 16, wherein the charging completion indicating module further comprises a disable terminal coupled to the enable terminal of the switch driver, and further configured to output a disable signal via the disable terminal after a second preset time period elapses since a second trigger signal is received via the input terminal.

18. The current limiter of claim 17, wherein the disable signal is a low level voltage signal, which is capable of overriding the enable signal output from the voltage protection module.

19. A hotswap module for an electronic device, the hotswap module comprising the current limiter of claim 1.

20. A method of operating a current limiter, wherein the current limiter comprises i) a current limiting module having an input terminal, an output terminal, and a control terminal, and configured to limit a current, which is input via its input terminal, within a current limiting range and ii) a range controlling module having a control terminal coupled to the control terminal of the current limiting module and a sensing terminal coupled to the output terminal of the current limiting module, and configured to generate a control signal at least based on the current which is output via the output terminal of the current limiting module and which is sensed at the sensing terminal, and output the control signal via its control terminal, such that the current limiting range is dynamically adjustable based on the control signal, the method comprising: at a first stage, inputting a first signal into the current limiter, such that the first signal has a current level limited into a first current limiting range; and at a second stage after a first preset time period elapses since the first signal is received via the input terminal of the current limiter, inputting a second signal into the current limiter, such that the second signal has a current level limited into a second current limiting range, wherein the second current limiting range is different from the first current limiting range, and the range controlling module comprises: a charging completion indicating module having an input terminal and an output terminal, and configured to output a charging completion indicating signal via the output terminal after the first preset time period elapses since a first trigger signal is received via the input terminal; and a range selecting module having an input terminal coupled to the output terminal of the charging completion indicating module and an output terminal, and configured to initially output a first range selection signal via its output terminal, and output a second range selection signal via its output terminal when the charging completion indicating signal is received via its input terminal, the second range selection signal being associated with a different current limiting range than that associated with the first range selection signal.

* * * * *